(12) United States Patent
Gorog et al.

(10) Patent No.: US 8,259,258 B2
(45) Date of Patent: Sep. 4, 2012

(54) LIQUID CRYSTAL DISPLAY HAVING A FIELD EMISSION BACKLIGHT

(75) Inventors: Istvan Gorog, Lancaster, PA (US); Peter Michael Ritt, East Petersburg, PA (US)

(73) Assignee: Thomson Licensing, Boulogne-Billancourt (FR)

( * ) Notice: Subject to any disclaimer, the term of this patent is extended or adjusted under 35 U.S.C. 154(b) by 195 days.

(21) Appl. No.: 12/308,906

(22) PCT Filed: Oct. 4, 2006

(86) PCT No.: PCT/US2006/038827
§ 371 (c)(1),
(2), (4) Date: Dec. 29, 2008

(87) PCT Pub. No.: WO2008/002320
PCT Pub. Date: Jan. 3, 2008

(65) Prior Publication Data
US 2009/0185110 A1 Jul. 23, 2009

Related U.S. Application Data

(60) Provisional application No. 60/817,241, filed on Jun. 28, 2006.

(51) Int. Cl.
*G02F 1/1335* (2006.01)
(52) U.S. Cl. .......................................... 349/71; 349/70
(58) Field of Classification Search .................... 349/70, 349/71
See application file for complete search history.

(56) References Cited

U.S. PATENT DOCUMENTS

| | | | |
|---|---|---|---|
| 3,571,897 A | 3/1971 | Heil |
| 4,907,862 A | 3/1990 | Suntola |
| 5,053,765 A | 10/1991 | Sonehara et al. |
| 5,347,201 A | 9/1994 | Liang et al. |
| 5,466,990 A | 11/1995 | Winsor |
| 5,611,719 A | 3/1997 | Vickers et al. |
| 5,760,858 A | 6/1998 | Hodson et al. |
| 5,827,624 A | 10/1998 | Stansbury |
| 5,926,239 A | 7/1999 | Kumar et al. |
| 6,005,342 A | 12/1999 | Morton |
| 6,031,328 A | 2/2000 | Nakamoto |
| 6,137,218 A | 10/2000 | Kaneko et al. |
| 6,197,218 B1 | 3/2001 | Hampden-Smith et al. |
| 6,249,328 B1 | 6/2001 | Fukuzawa et al. |

(Continued)

FOREIGN PATENT DOCUMENTS

CN 1158489 9/1997

(Continued)

OTHER PUBLICATIONS

Souriau et al, "Cathodoluminescent properties of coated SrGa2S4:Eu2+ and ZnS:Ag,Cl phosphors for field emission display applications", Materials Science and Engineering B76 (2000), pp. 165-168.

(Continued)

*Primary Examiner* — Rhonda Peace
(74) *Attorney, Agent, or Firm* — Robert D. Shedd; Harvey D. Fried; Richard LaPeruta (57) ABSTRACT

An LCD display has a programmable backlight device that produces multiple different color fields from multiple different phosphor elements. The backlight device can be a low resolution FED device. The phosphor is applied by an electrophotographic screening process or direct electrostatic screening process. The FED device can further incorporate a wide gamut phosphor.

24 Claims, 10 Drawing Sheets

U.S. PATENT DOCUMENTS

| | | |
|---|---|---|
| 6,252,569 B1 | 6/2001 | Hodson et al. |
| 6,268,843 B1 | 7/2001 | Arakawa |
| 6,300,021 B1 | 10/2001 | Gorog et al. |
| 6,353,286 B1 | 3/2002 | Talin et al. |
| 6,426,590 B1 | 7/2002 | Chung et al. |
| 6,448,709 B1 | 9/2002 | Chuang et al. |
| 6,515,414 B1 | 2/2003 | Cathey et al. |
| 6,570,322 B1 | 5/2003 | Rasmussen |
| 6,573,961 B2 | 6/2003 | Jiang et al. |
| 6,690,349 B2 | 2/2004 | Bruning et al. |
| 6,713,953 B1 | 3/2004 | Sung et al. |
| 6,768,255 B1 | 7/2004 | Na |
| 6,816,141 B1 | 11/2004 | Fergason |
| 6,891,672 B2 | 5/2005 | Whitehead et al. |
| 6,950,088 B2 | 9/2005 | Dalal |
| 7,046,262 B2 | 5/2006 | Feng et al. |
| 7,064,740 B2 | 6/2006 | Daly |
| 7,093,970 B2 | 8/2006 | Jang |
| 7,532,192 B2 | 5/2009 | Feng et al. |
| 7,612,757 B2 | 11/2009 | Feng et al. |
| 7,872,631 B2 * | 1/2011 | Feng et al. ............... 345/102 |
| 2001/0035922 A1 | 11/2001 | Park et al. |
| 2002/0064682 A1 | 5/2002 | Yano et al. |
| 2002/0115269 A1* | 8/2002 | Harshbarger et al. ........ 438/482 |
| 2003/0085906 A1 | 5/2003 | Elliot et al. |
| 2003/0190772 A1 | 10/2003 | Toyota et al. |
| 2004/0113906 A1 | 6/2004 | Lew et al. |
| 2004/0147049 A1* | 7/2004 | Lee et al. ................ 438/20 |
| 2004/0169774 A1 | 9/2004 | Hibi et al. |
| 2004/0245910 A1* | 12/2004 | Tang et al. ............... 313/483 |
| 2005/0083295 A1 | 4/2005 | Daly |
| 2005/0176335 A1 | 8/2005 | Toyota et al. |
| 2005/0179380 A1 | 8/2005 | Oh et al. |
| 2005/0184952 A1 | 8/2005 | Konno et al. |
| 2005/0189517 A1 | 9/2005 | Hampden-Smith et al. |
| 2005/0200269 A1 | 9/2005 | Ng et al. |
| 2005/0225574 A1 | 10/2005 | Brown Elliott et al. |
| 2005/0227570 A1 | 10/2005 | Toyota et al. |
| 2005/0248520 A1* | 11/2005 | Feng et al. ............... 345/87 |
| 2006/0007112 A1 | 1/2006 | Park |
| 2006/0119762 A1* | 6/2006 | Haba ................... 349/61 |
| 2006/0274026 A1 | 12/2006 | Kerofsky |
| 2007/0024772 A1 | 2/2007 | Childers et al. |
| 2007/0040960 A1* | 2/2007 | Yoo et al. ............... 349/70 |
| 2008/0007154 A1* | 1/2008 | Wei et al. ............... 313/497 |
| 2008/0191607 A1 | 8/2008 | Kawai |
| 2009/0186165 A1* | 7/2009 | Gorog et al. ............. 427/532 |
| 2010/0045589 A1* | 2/2010 | Edwards et al. ........... 345/102 |
| 2010/0060820 A1* | 3/2010 | Kleppinger et al. ........ 349/68 |
| 2010/0164366 A1* | 7/2010 | Collins et al. ........... 313/503 |

FOREIGN PATENT DOCUMENTS

| | | |
|---|---|---|
| CN | 2309577 Y | 3/1999 |
| CN | 101479653 A | 7/2009 |
| EP | 1521232 | 4/2005 |
| EP | 1521232 A2 | 4/2005 |
| GB | 803019 | 10/1958 |
| JP | 58-189943 | 11/1983 |
| JP | 3-71111 A | 3/1991 |
| JP | 8-339762 | 12/1996 |
| JP | 10-134717 A2 | 5/1998 |
| JP | 11-007016 | 1/1999 |
| JP | 2000-066168 A2 | 3/2000 |
| JP | 2001-142409 A2 | 5/2001 |
| JP | 2001-222967 A | 8/2001 |
| JP | 2001-283721 A2 | 10/2001 |
| JP | 2002-055340 A | 2/2002 |
| JP | 2002-124180 A2 | 4/2002 |
| JP | 2002-207366 A | 7/2002 |
| JP | 2003-043483 A2 | 2/2003 |
| JP | 2003-068217 A | 3/2003 |
| JP | 2003-242885 A2 | 8/2003 |
| JP | 2005-260229 | 9/2005 |
| JP | 2006-154235 | 6/2006 |
| JP | 2006156377 | 6/2006 |
| WO | 9822849 A1 | 5/1998 |
| WO | 9836888 A1 | 8/1998 |
| WO | 2005107237 A1 | 11/2005 |
| WO | 2006032950 A2 | 3/2006 |
| WO | 2008002320 A1 | 1/2008 |

OTHER PUBLICATIONS

International Search Report, dated Jan. 26, 2007.

Chalamala et al.: "Displaying a Bright Future," IEEE Circuits and Devices Magazines, IEEE Service Center, Piscataway, NJ, vol. 16, No. 3, May 2000, pp. 19-30, XP011083429.

GIRI: "Field Emitter Display (FED) Technology," Proceedings of the SPIE, Mar. 1995, vol. 2462, pp. 66-74.

* cited by examiner

PRIOR ART

LIQUID CRYSTAL DISPLAY HAVING A FIELD EMISSION BACKLIGHT

RELATED APPLICATIONS

This application claims the benefit, under 35 U.S.C. §365 of International Application PCT/US2006/38827, filed on Oct. 4, 2006, which was published in accordance with PCT Article 21(2) on Jan. 3, 2008, in English and which claims the benefit of U.S. provisional patent application No. 60/817,241, filed on Jun. 28, 2006.

This application relates to U.S. application Ser. No. 12/448,297 filed on Dec. 5, 2007 which published as U.S. Pat. No. 2010-0045589A1; Ser. No. 12/308,816 filed on Oct. 4, 2006 which published as U.S. Pat. No. 2009-0186165A1; and Ser. No. 12/448,285 filed on Dec. 18, 2006 which published as U.S. Pat. No. 2010-0060820-A1.

FIELD OF INVENTION

The invention relates to liquid crystal displays having intelligent backlighting.

BACKGROUND OF THE INVENTION

Figure 1:
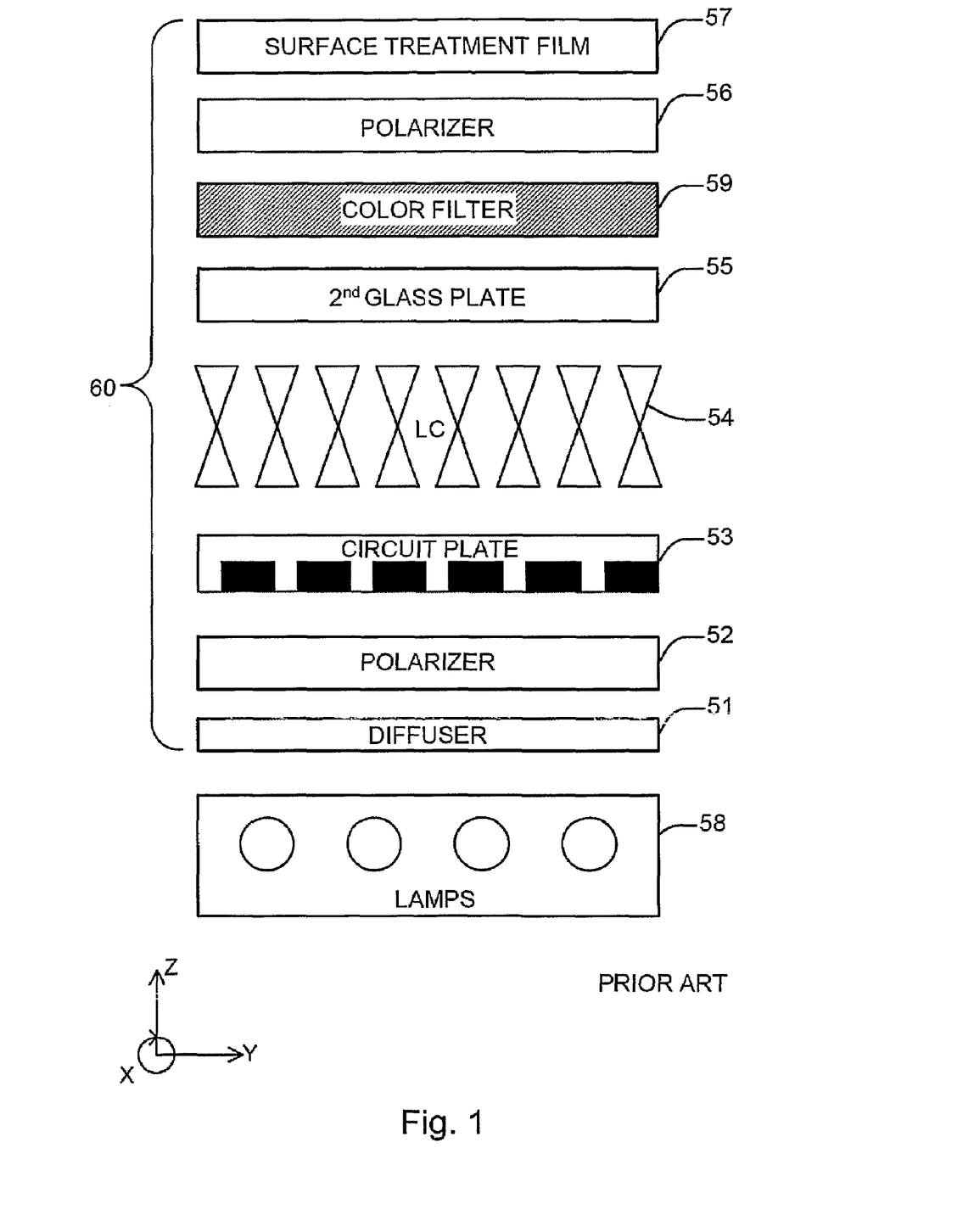
FIG. 1 is a sectional view of an existing LCD with backlight lamps.

Liquid crystal displays (LCDs) are in general light valves. Thus, to create an image they must be illuminated. The elementary picture areas (pixels, sub-pixels) are created by small area, electronically addressable, light shutters. In conventional LCD displays, color is generated by white light illumination and color filtering of the individual sub-pixel light transmissions that correspond to the individual Red, Green, and Blue sub-images. More advanced LCD displays provide programmability of the backlight to allow motion blur elimination through scrolling of individual pulsed lights. For example, scrolling can be achieved by arranging a number of cold cathode fluorescent lamps such as the LCD display in U.S. Pat. No. 7,093,970 (having approximately 10 bulbs per display) in a manner such that the long axis of the lamps is along the horizontal axis of the display and the individual lamps are activated in approximate synchronism with the vertically progressive addressing of the LCD displays. Alternatively, hot filament fluorescent bulbs can be employed and can likewise be scrolled, with the individual bulbs progressively turning on and off in a top-to-bottom, cyclic manner, whereby the scrolling can reduce motion artifacts. Known LCDs which can utilize scrolling can have a configuration similar to that shown is FIG. 1. The backlighting lamps 58 are positioned before a diffuser 51. Following the diffuser 51 is a polarizer 52 and a circuit plate 53 having address circuits and associated first surface pixel electrodes on a first glass substrate plate. The device further includes the liquid crystal material (LC) 54 positioned after the circuit plate 53. The LCD display also includes a second glass plate 55 supporting second surface electrodes, a color filter 59, a second polarizer 56 and a surface treatment film 57, as shown and ordered in FIG. 1.

A further improvement to the standard LCD technology can be obtained by utilizing LEDs (Light Emitting Diodes) for the backlights. By arranging such LEDs in a uniformly distributed manner behind the liquid crystal material and providing three sets of LEDs (Blue, Green, and Red) that comprise the entire backlighting system, additional programmability and additional performance gains can be obtained. Key features of such LED illuminators include superior black levels, enhanced dynamic range, and also the elimination of the color filter 59 indicated in FIG. 1. The color filter 59 can be eliminated by operating the backlight and the LCD in a color field sequential manner. While LED backlights can provide excellent image characteristics, their costs are high.

BRIEF SUMMARY OF THE INVENTION

A liquid crystal display comprises a liquid crystal front end component and a field emission backlight component. The backlight can have one or more individual elements having different colors of phosphor. The plurality of individual elements are grouped into repeat units, where the display can have more than 10 repeat units. The backlight component is programmable and synchronized such that selected groups of the individual elements will activate in conjunction with activation of associated liquid crystal cells of the liquid crystal front end component. At least one of the individual elements can comprise a water incompatible phosphor such as a strontium thiogallate:europium phosphor to enhance the color gamut of the liquid crystal display. The plurality of individual elements can run in columns or rows. The ratio of individual columns or rows to the number of pixel lines of the LCD component is in the range of 1:3-1000. In a preferred embodiment, the ratio is 1:100-1000. The field emission backlight component can use a cathode comprising carbon nanotubes. The field emission backlight component can operate at an anode potential of 10-20 kV.

DETAILED DESCRIPTION OF THE PREFERRED EMBODIMENTS

Figure 2:
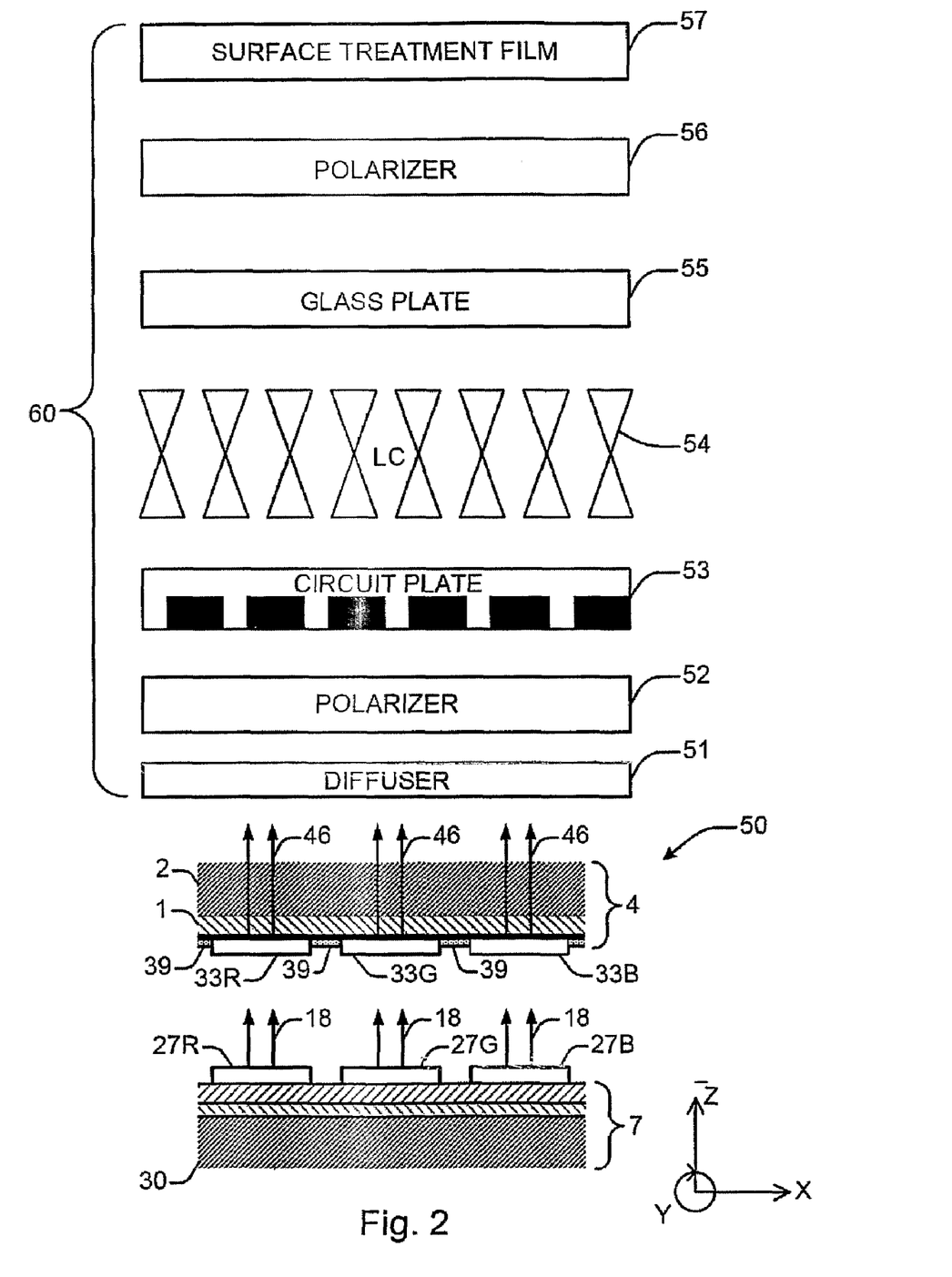
FIG. 2 is a sectional view of an LCD with multicolor backlighting according to the invention.
Figure 3:
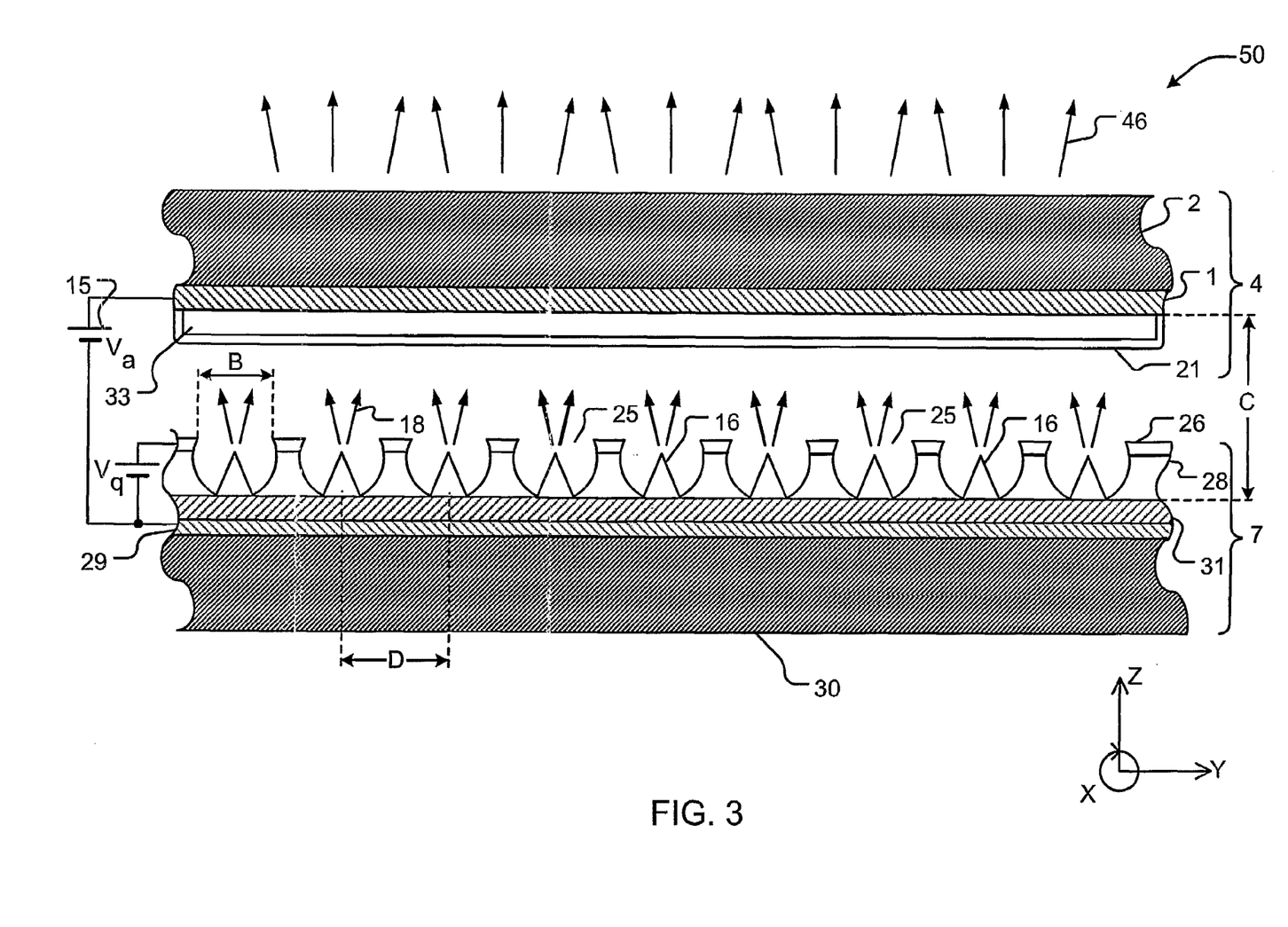
FIG. 3 is a sectional view of a field emission device used for backlighting an LCD according to the invention.
Figure 4:
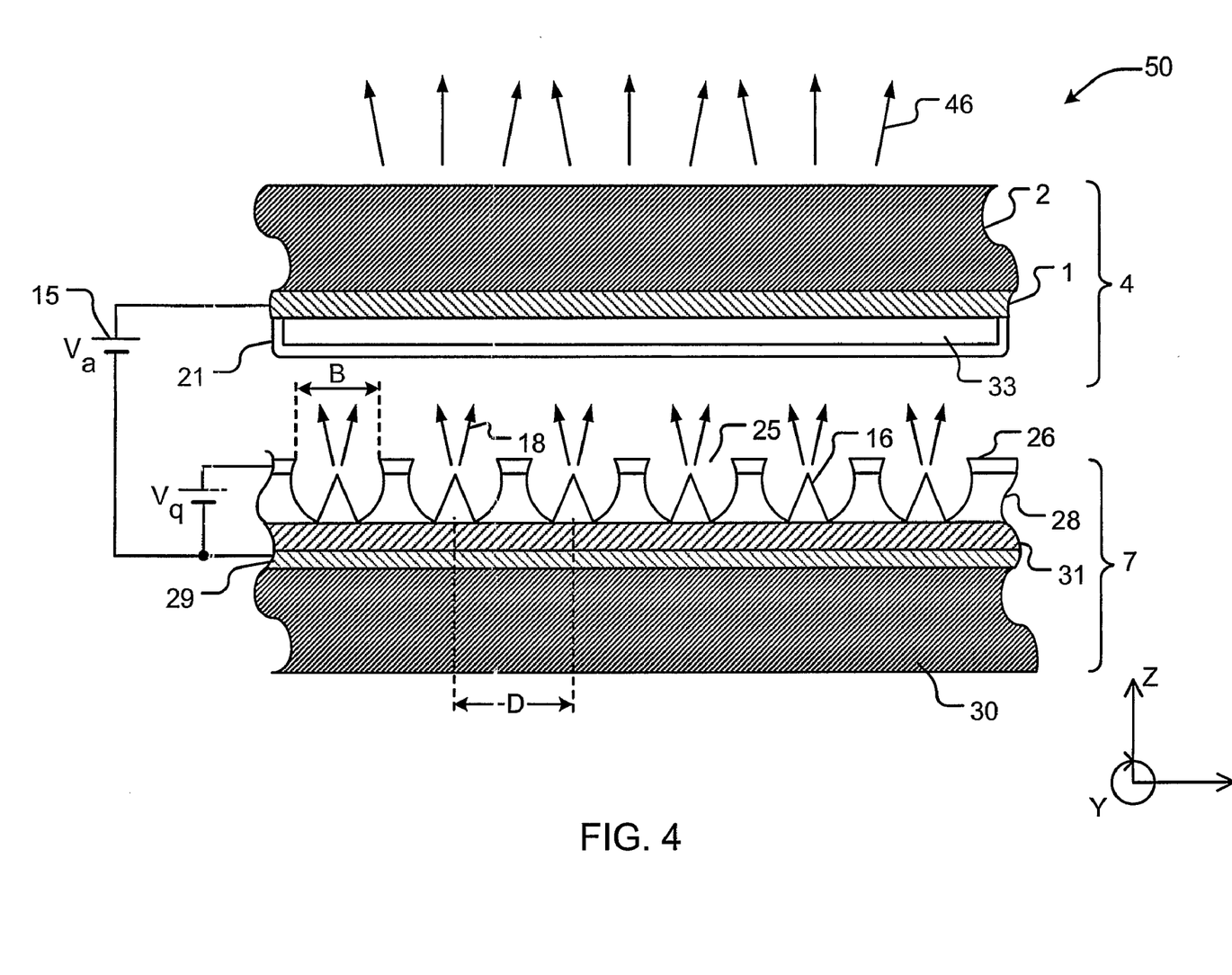
FIG. 4 is another sectional view of a field emission device used for backlighting an LCD according to the invention.
Figure 5:
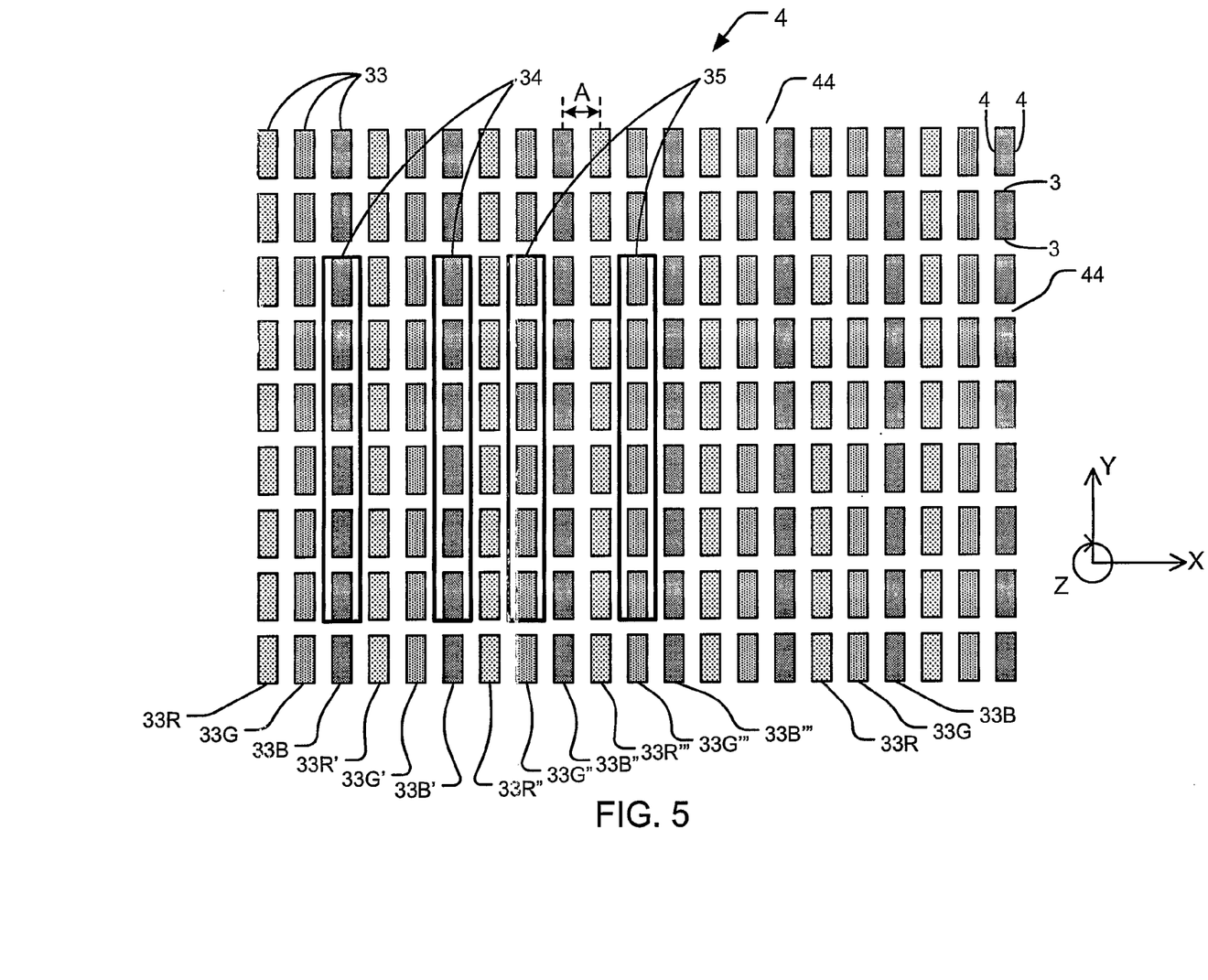
FIG. 5 is a plan view of a plurality of phosphor elements in the field emission device according to the invention.

An exemplary embodiment of the present invention will be described with reference to the accompanying figures. FIG. 2 shows a cross sectional view of an exemplary LCD display having an LCD front end component 60 and an FED backlight (or FED backlight component) 50. In the exemplary embodiment, the individual phosphor elements 33 run in vertical stripes or patched as shown in FIG. 5; however, the invention does include embodiments where the phosphor elements 33 run horizontally and where the phosphor elements of a given color run continuously. FIGS. 3 and 4 show different cross sectional views of the FED backlight 50 according to the exemplary embodiment of the invention. In the figures, the Y-axis is the vertical axis and the X-axis is the horizontal axis. As will be described, having the individual phosphor elements permits intelligent backlighting for the LCD.

The FED backlight 50 has a cathode 7 comprising a plurality of emitters 16 arranged in an array that emit electrons 18 due to an electric field created in the cathode 7. These electrons 18 are projected toward the anode 4. The anode 4 can comprise a glass substrate 2, having a transparent conductor 1 deposited thereon. The individual phosphor elements 33 can then be applied to the transparent conductor 1 and can be separated from one another. The transparent conductor 1 can be indium tin oxide. The phosphor elements 33 can comprise red phosphor (33R), green phosphor (33G), and blue phosphor (33B), as arranged FIG. 5.

The operation of the FED backlight 50 involves the electrons 18 from the plurality of emitters 16 in a cathode 7 striking phosphor elements 33 on an anode plate 4 and causing photon emission 46. A grouping of emitter cells 27R, 27G, 27B represented in FIG. 2 correspond to individual phosphor elements 33. Potential 15 is applied to the anode 4 during display operation. To emit electrons 18 from particular array emitter apertures 25, a gate potential Vq is applied to specific gates 26 which may be supported on dielectric material 28. As shown in FIGS. 3 and 4, a plurality of gates 26 (and consequently a plurality of emitter cells) can be used in one phosphor element 33.

The dielectric material 28 and electron emitters 16 can be supported on a cathode assembly 31 which can be supported on a cathode back plate 29, which in turn is supported on back plate support structure 30.

The brightness of the FED backlight 50 can be greatly enhanced by the presence of thin, reflective metal film 21 on the cathode side of the phosphor. Essentially, the reflective metal film 21 can double the light 46 observed by the viewer. The reason is that the reflective metal film 21 reflects the portion of the light emitted toward the cathode plate so that upon reflection it propagates away from the cathode 7 toward the viewer.

FIG. 2 shows an exemplary embodiment of the LCD display utilizing the FED 50 shown in FIGS. 3-5. Here the FED backlights 50 are positioned before a diffuser 51. The LCD display according to the invention is generally intended to include the diffuser 51. Following the diffuser 51 is a polarizer 52 and a circuit plate 53. The diffuser 51 and polarizer stack may include additional brightness enhancement elements such as a Vikuiti™ optical film made by 3M which increases the brightness of liquid crystal displays (LCDs) by recycling otherwise unused light (such as that is absorbed by the polarizer) and optimizing the angle of the light incident on the liquid crystal. The LCD further includes the liquid crystal materials (LC) 54 positioned after the circuit plate 53. The LCD display also includes a second glass plate 55, a second polarizer 56 and a surface treatment film 57, as shown and ordered in FIG. 2. Regarding the emitters 16 shown in FIGS. 3 and 4, they are shown as being conical microtips emitters. However, carbon nanotubes emitters are preferred. Carbon nanotube cathodes can be effective in FEDs operating at anode potential of 10 kV or greater in the pixel resolution range of 1 mm and larger. A low resolution FED with a coarse diffuser 51 provides a substantially locally uniform backlight for the LCD display. (Low resolution implies that a specific phosphor element or a specific repeat unit of phosphor elements are not exclusive to a specific LCD pixel.) A feature of the invention is that the plurality of the individual colors from the different phosphor elements 33 can pass through an individual LCD pixel having but one LCD cell, which can provide white light or green light, red light, blue light, or combinations thereof when appropriate phosphor elements 33 are activated and light therefrom is appropriately diffused in the vicinity of the LCD pixel.

A feature of the invention is that the backlight can be a programmable FED structure, which is referred to as being an intelligent backlight. This means that the FED can selectively provide specific colored light to specific regions on the screen. This is a benefit because the light is coordinated with the activation and deactivation of the various liquid crystal cell regions. By the FED backlights being programmable, the LCD can achieve good black levels, wide dynamic range, and blur-free motion rendition. Furthermore, it is desirable to provide a backlight having as large a color gamut as possible. These characteristics are most conveniently achieved by utilizing a low resolution FED as a backlight wherein the light-emitting phosphor materials incorporated into the FED are selected to provide a wide color gamut.

The novel Field Emission Device (FED) backlight surprisingly exhibits all the desirable characteristics of an LED, but at substantially lower cost. With the disclosed FEDs being programmable, they can operate in a color field sequential manner. While the FED structure shown in FIG. 2 includes a black matrix 39, a commercial quality LCD display with the FED is attainable without the black matrix. (The black matrix will, however, still provide some nominal improvement in black fields and in contrast.) Appropriate x-y addressing of the cathode plate allows programmable emission of electrons from a cold cathode, most conveniently constructed with carbon nanotube (CNT) technology. A key advantage of FEDs is that their programmability is achieved with low voltage and low current signals applied in an x-y matrix manner to the cathode structure. Furthermore, as a consequence of the inherent non-linearity of the field emission phenomenon, no active devices are needed to be incorporated as switches at the x-y junctions. A further advantage of FEDs is that the power source for the emitted light is a simple DC power supply that in this application is preferably operated in the 10-20 kV range. A suitable FED for intelligent backlights may comprise 10-1,000 individually programmable rows and approximately the same number of columns. In the example FED shown in FIG. 5, each column has only one phosphor type and the phosphor colors cycle along each row. In this case, the system can have vertical programmability, wherein columns can be turned on in their entirety. Alternatively, each row may comprise a single phosphor color. In this case horizontal programmability is provided, wherein a row may be turned on in its entirety. For the backlight according to the invention, suitable pitches A (in FIG. 5) between the individual phosphor elements 33 can be dictated by the desired performance requirement of the LCD display. An example dimension of the pitch A can be several millimeters (e.g., 1-5 mm). As shown in FIGS. 3 and 4, an individual phosphor element 33 can have a plurality of emitter cells each with array emitter apertures 25 having opening dimension B, as shown in FIG. 3. Suitable opening dimension B values can be about 10 microns. (The opening dimension B in FIGS. 3 and 4 does not necessarily have to be the same value.) The pitch of emitter cells D can be around 15-30 microns. (The pitch of emitter cells D in FIGS. 3 and 4 does not necessarily have to be the same value.) Regarding the spacing C between the anode plate 4 and the cathode plate 7, it turns out that a spacing C from 1 millimeter to several millimeters works very well for the FED in a backlight mode in the LCD display. Preferably, the spacing C is 1-5 mm, which helps to maintain a very thin display. The spreading of electrons due to space charge and emission angle associated with these spacings turns out to not be detrimental to the color performance of backlight when the pitch A is larger than about 1 mm. In other words, the LCD has a relatively low resolution requirement for the backlight when the intelligent backlighting is used. As such, electron spreading between the anode and the cathode plates is of no significant concern. The carbon nanotube FED can provide excellent light output subject to visible graininess due to emission non-uniformities. In the disclosed device, the undesirable consequences of such emission non-uniformities are rendered imperceptible through the use of an appropriate diffuser between the FED backlight and the liquid crystal device. Preferably the disclosed FED backlight is operated in the color sequential mode, thus no color filters are required; however, another embodiment of the invention can include color filters which could provide an opportunity for narrower color wavelength ranges. For example, in an FED backlight employing 300 individually addressable rows one could assign 100 of these rows to each of the three colors—Red, Green, Blue, such that upon activating the appropriate control signals in a time sequential manner at any one time only the Red or the Green or the Blue phosphor elements from the anode plate are lit up. FIG. 5 shows an example array of the FED device in plan view of a hypothetical situation in which blue backlight is desired at a certain time in several rows of two adjacent colored groupings represented as first block 34 (i.e., Red 33R, Green 33G, Blue 33B and Red 33R', Green 33G', Blue 33B') and green backlighting is desired next in time in the same rows but the next two adjacent colored groupings represented as second block 35 (i.e., Red 33R'', Green 33G'', Blue 33B'' and Red 33R''', Green 33G''', Blue 33B'''). Note that in the example shown in FIG. 5, only 6 phosphor elements 33 in a column are shown as activated at a certain time; however, the LCD can be designed and operated to have the entire column or fraction thereof in the FED activated when such color is needed in a particular region of the screen in the LCD. The ratio of individual columns or rows of the individual phosphor elements 33 to the number of pixels lines of the LCD component according to the invention is in the range of 1:3-1000. In a preferred embodiment, the ratio is 1:100-1000. The ratio being between 1:100-1000 is preferred because it requires less individual electrical connections, but yet provides adequate backlight uniformity and programmability.

Another aspect of the invention is the selection of phosphor to be used in the FED backlight 50. It is desirable to provide the widest possible color gamut. Known FEDs utilize either low voltage phosphor materials or CRT phosphor materials. In the 10-15 kV preferred operating range, CRT phosphor materials are the most suitable. Different phosphor materials and their characteristics are indicated in the following table.

shown in the table, the efficiency of the NTSC Green phosphor is less than 50% of the CRT Green phosphor. Furthermore, the NTSC Green has a long decay time. Thus it may result in a motion delay. Therefore, the TV industry has completely switched from the original NTSC Green to the CRT Green.

Figure 6:
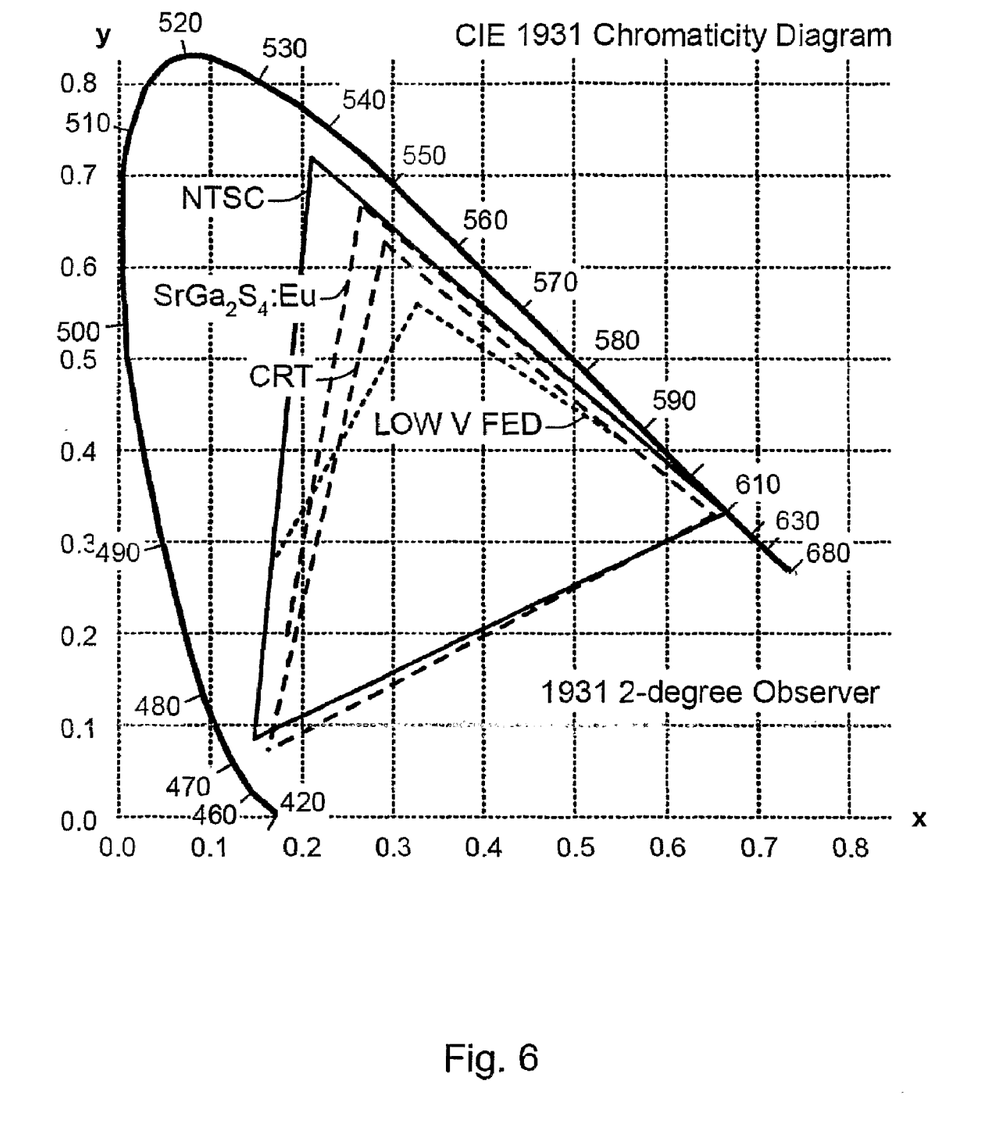
FIG. 6 shows the CIE 1931 Chromaticity Diagram.

An alternative Green phosphor, strontium thiogallate:europium, has been identified. The CIE 1931 Chromaticity Diagram shown in FIG. 6 shows that strontium thiogallate:europium provides a color gamut exceeding that of CRT Green and approaching that of the NTSC Green. The negative aspect of strontium thiogallate:europium phosphor is that it is moisture-sensitive (i.e., chemically decomposes by water). Therefore, such a phosphor cannot be applied with the standard commercial screening techniques, because they require the use of water. As such, strontium thiogallate:europium phosphor could not be considered.

However, another aspect of the invention provides the means to include non-water compatible phosphor. Two novel electrostatic techniques for screening water-incompatible phosphor are herein disclosed for FEDs. One is an electrophotographic screening process (EPS) and the other is a direct electrostatic screening process (DES).

Figure 7:
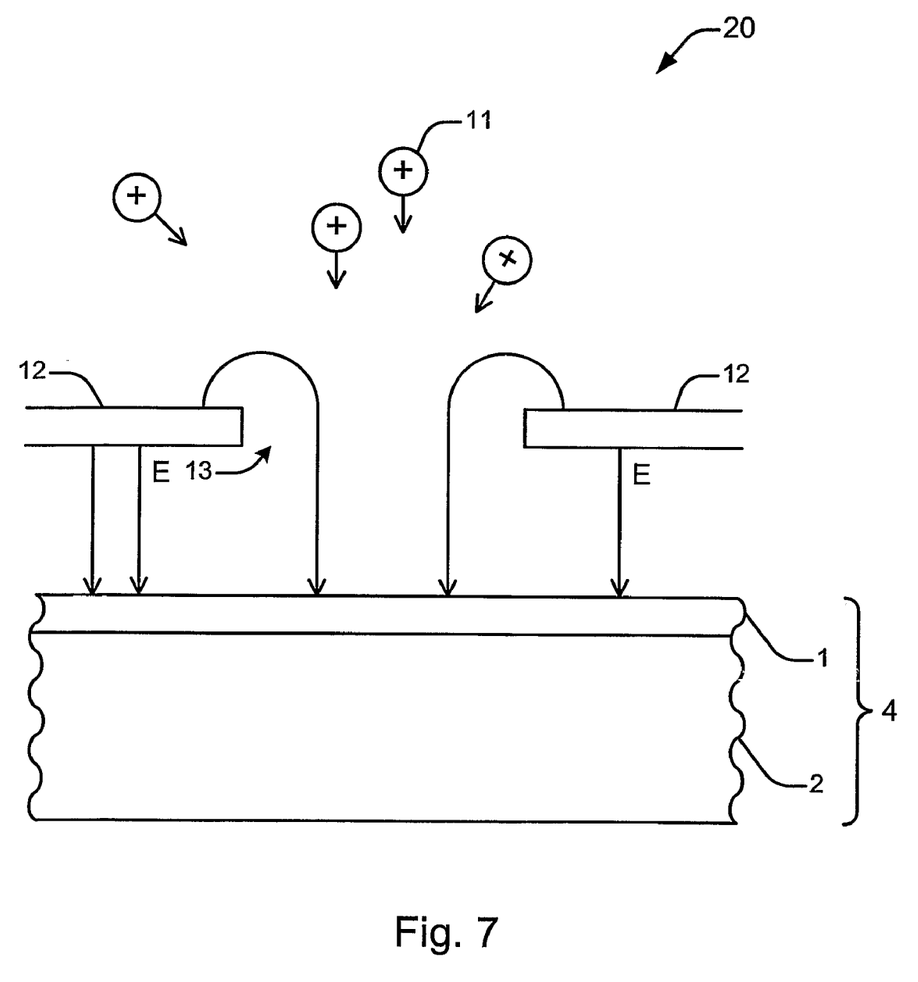
FIG. 7 shows a sectional view of the deposition of charged phosphor according to one direct electrostatic process (DES) according to the invention.

One direct electrostatic process (DES) can be best understood with reference to FIG. 7. The process can begin with the application of a conductor on the glass surface. FIG. 7 shows an unfinished anode plate 4 having the conductor 1 on glass substrate 2. The conductor 1 can be made either by the deposition of a thin layer of metal (e.g. rhodium) or an organic conductor. In the case where an inorganic conductor will remain inside the FED structure after subsequent processing and/or finishing, the conductor must be transparent. In case of an organic conductor, one can bake out the organic conductor in subsequent processing steps; as such, transparency is not required for such conductors.

Next, the process involves placing an electrostatic mask 12 having apertures 13 positioned some distance in front of the glass substrate 2. The dimension of the apertures 13 can be approximately the desired dimension of the phosphor stripes (i.e. the width of the 33R, 33B and 33G such as shown in FIGS. 2 and 5). Approximately implies the aperture 13 dimensions are about +/−20% the size of the target width of the phosphor stripe. A bias voltage between the electrostatic mask and the conductor coating the substrate is then applied. The bias voltage will result in an electric field indicated by arrows and the associated letter "E" in FIG. 7. A flux of charged phosphor particles 11 in a chamber 20 (which can be a closed box structure having appropriate plumbing for piping in the flux) is then caused to move toward the substrate 2 and its associated electrostatic mask 12. As such, the flux is

| Type | Phosphor | x | y | lm/w | Decay (s) | NTSC space (%) | Comments |
|---|---|---|---|---|---|---|---|
| NTSC Green | $Zn_2SiO_4$: Mn (Zinc Orthosilicate-Magnanese) | 0.21 | 0.71 | 31 | $10^{-2}$ | 100 | Large color gamut and low efficacy |
| CRT Green | ZnS: Cu, Al, Au (Zinc Sulfide-Copper, Aluminum, Gold) | 0.30 | 0.62 | 65 | $10^{-5}$ | 70 | High efficacy EBU - skin tones |
| Alternative Green | $SrGa_2S_4$: Eu (Strontium Thiogallate: Europium) | 0.27 | 0.68 | 55 | $10^{-6}$ | 85 | Good gamut; high current saturation; moisture sensitive |
| CRT Blue | ZnS: Ag (Zinc Sulfide-Silver) | 0.14 | 0.05 | 10 | $10^{-5}$ | 100 | High efficacy; pigment added |
| CRT Red | $Y_2O_2S$: Eu (Yttrium oxysulfate-europium) | 0.66 | 0.33 | 16 | $10^{-3}$ | 100 | High efficacy; pigment added |

The NTSC phosphor materials provide substantially wider color gamut than do CRT phosphor materials. This is shown in the CIE 1931 Chromaticity Diagram in FIG. 6. But as introduced to the chamber 20 on the side of the mask opposite of the glass substrate. The phosphor particles 11 have a charge similar to the electrostatic mask. As the phosphor particles 11 approach the mask, the particles will be guided by the fringing electric fields away from the solid surface of the mask 12 and through the aperture 13 such that they will be deposited on top of the conductor 1 underneath the aperture 13. The process steps outlined above are done for a first color phosphor. To apply other phosphor of different color, another electrostatic mask 12 can replace the first mask and be appropriately positioned to apply the next flux of phosphor particles of another color. Alternatively, the existing electrostatic mask 12 used for depositing the first color phosphor can be appropriately shifted to deposit the next color phosphor in the targeted locations for that second color.

Figure 8:
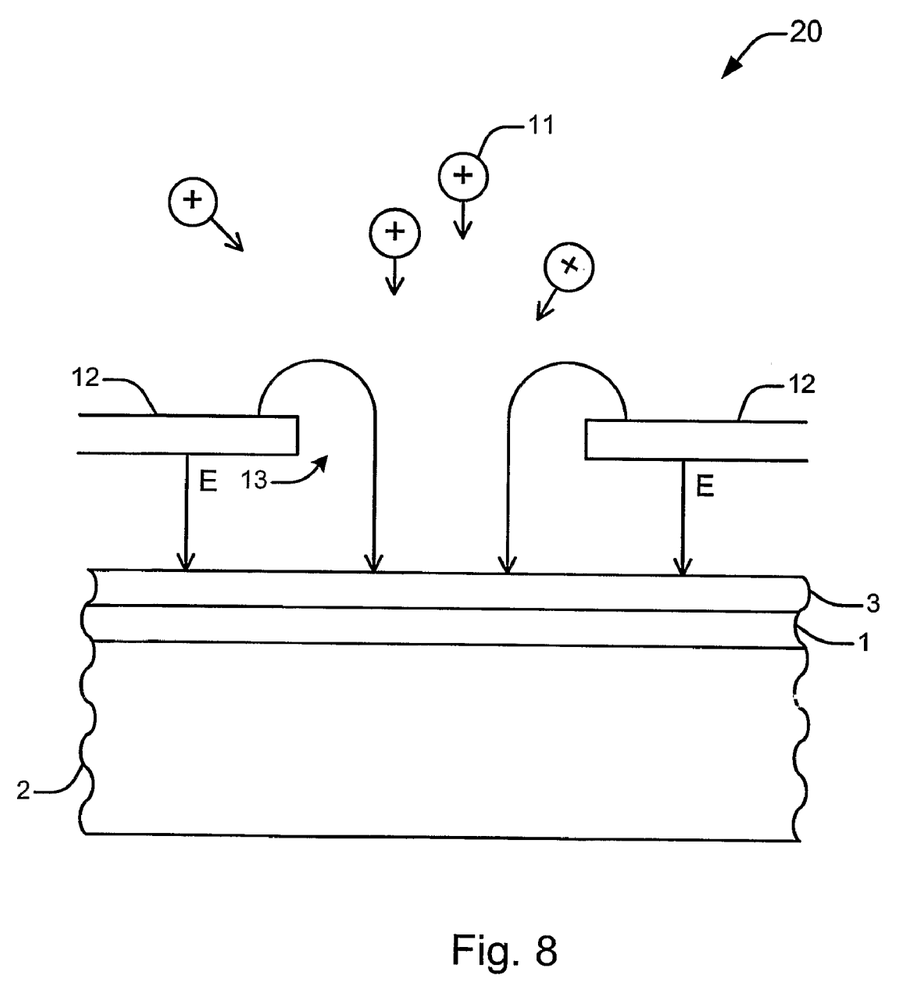
FIG. 8 shows a sectional view of the deposition of charged phosphor according to another direct electrostatic process (DES) of the invention.

FIG. 8 shows an alternative DES arrangement. The fundamental difference between the arrangement shown in FIG. 7 and that in FIG. 8 is the inclusion of an insulator layer 3 on top of the conductor 2 on the substrate. Fundamentally, the arrangement shown in FIG. 8 functions similarly to that shown in FIG. 7, except that here in FIG. 8 the phosphor particles 11 which have a charge and propagate through the apertures 13 of the electrostatic mask 12 will retain their charge as they deposit on the insulator 3, because they are separated from the underlying conductor 1 by the insulator 3. With the insulator 3, the process steps can be the same as those used in the application of phosphor particles 11 shown and described in FIG. 7.

By the inclusion of an insulator 3, another printing process is feasible. This other process which involves charging the insulator 3 through the apertures 13 of the electrostatic mask 11 with corona charges. The locations on the insulator that were aligned with the apertures 13 will now have a charge. Phosphor particles 11 having charge could then be introduced in the chamber and will deposit on the location of the conductor having the opposition charge of the phosphor particles 11.

Figure 9:
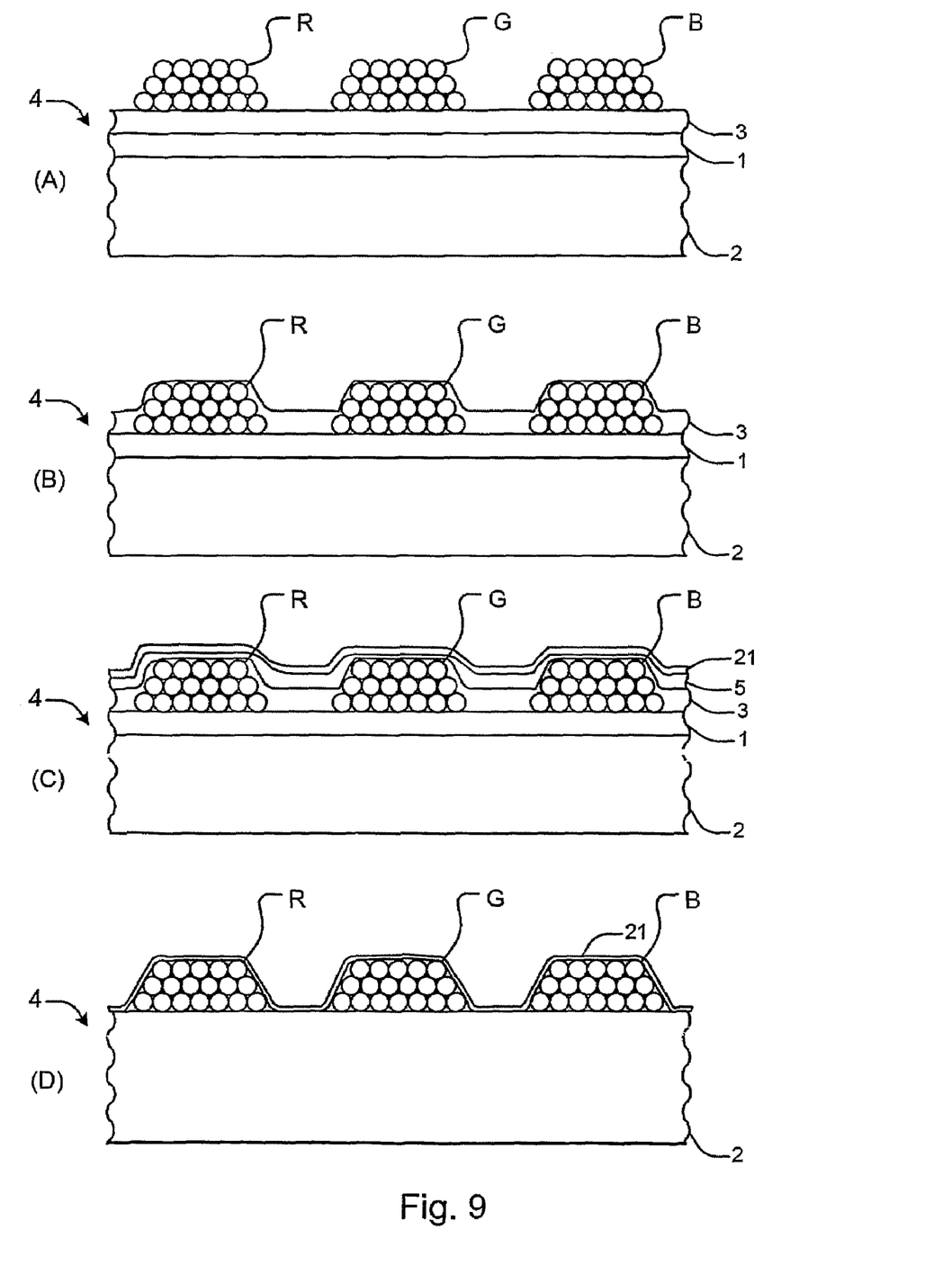
FIG. 9 shows process steps following the deposition of charged phosphor according to one of the direct electrostatic processes (DES)

The inclusion of an insulator 3 can also be advantageously utilized in a fixing step. The drawings in FIG. 9 show the various stages of the process according the embodiments having insulator and a fixing step. FIG. 9A shows a profile of the anode plate 4 following the deposition of three phosphor deposits and removal of the electrostatic mask. FIG. 9B shows the result of a fixing step. The fixing can occur by applying some solvent that partially dissolves the insulator, thereby allowing the phosphor particles to sink into the insulator 3 and allowing some of the insulator material through capillary action to diffuse up and into the phosphor. After the solvent evaporates, the result is that the phosphor deposits are now more strongly secured to the anode plate 4. Fixing helps to prevent unwanted movement of phosphor particles during a filming step. In a preferred embodiment the insulator is a polystyrene material of approximately 5-10 micrometers in thickness and the phosphor fixing is accomplished by spraying the anode plate with a solvent. Following the fixing step, a layer of lacquer film 5 can be applied to the anode plate, followed by the application a reflective metal film 21 as shown in FIG. 9C. After a bakeout step, the resulting structure of the anode plate 4 is shown in FIG. 9D, if no black matrix 39 is employed. If black matrix 39 is used it would be applied some time before the application of the reflective metal film 21 and the screen structure would resemble that structure shown in FIG. 2.

Figure 10:
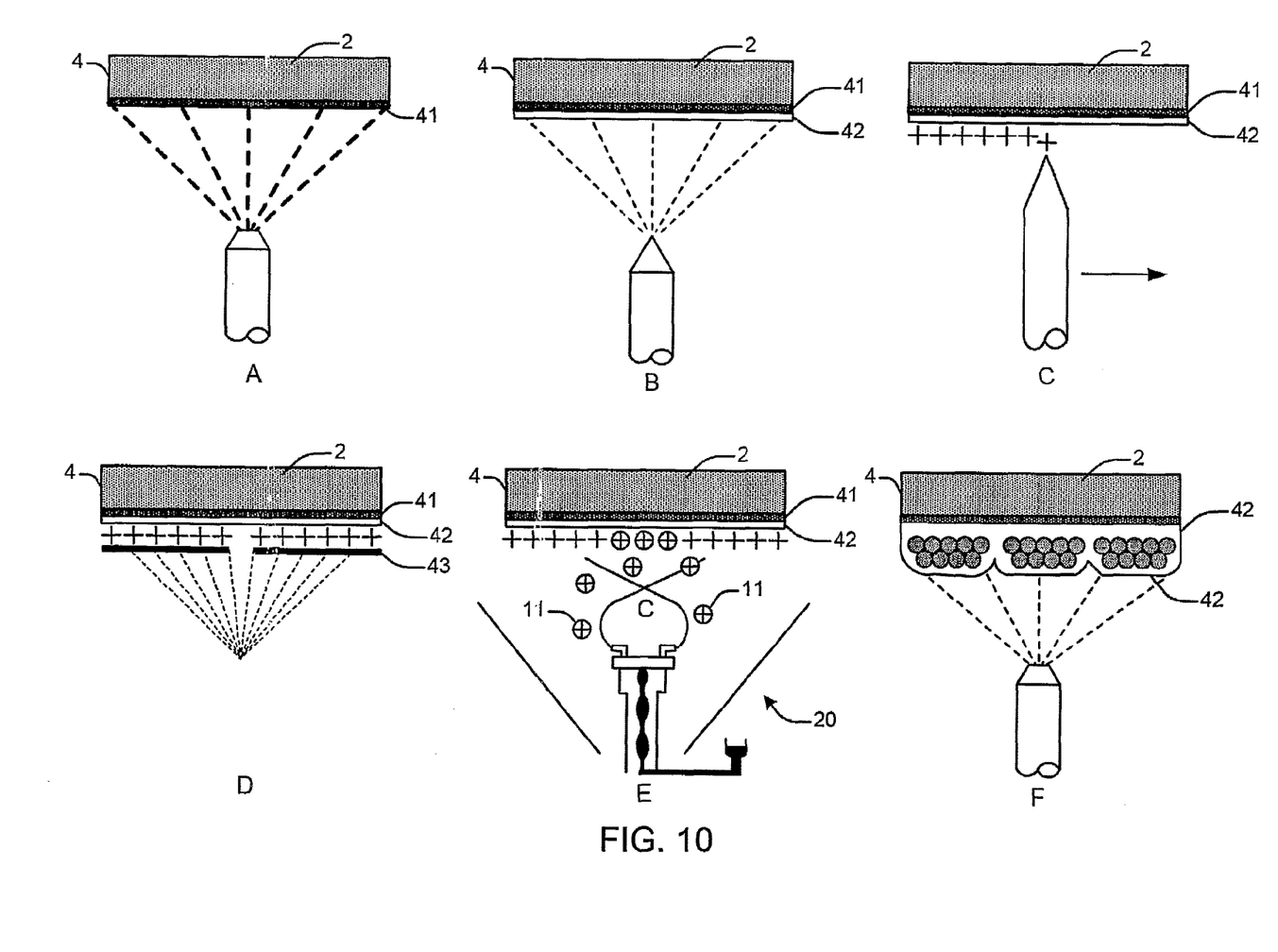
FIG. 10 shows a sectional view of the electrophotographic screening process (EPS) of deposition of charged phosphor according to the invention.

Alternatively, the phosphor elements can be deposited by an electrophotographic screening (EPS) process, which is generally shown in FIG. 10. The process begins by the application of an organic conductor film 41 as shown in FIG. 10A, followed by the application of an organic photoconductor film 42 as shown in FIG. 10B. The organic photoconductor film is then charged, preferably by a corona charger, which is represented in FIG. 10C. A mask 43 is then positioned by the screen. The mask 43 has apertures corresponding to the preferred locations of the phosphor elements. The organic photoconductor is then exposed to light which passes through the apertures of the mask 43 as shown in FIG. 10D. Areas of the organic photoconductor exposed to the light are discharged and regions not exposed remain charged. A flux of charged phosphor particles 11 in a chamber 20 (which can be a closed box structure having appropriate plumbing for piping in the flux) is then caused to move toward the substrate 2 and the charge phosphor particles 11 will then deposit on the regions of the organic photoconductor discharged as shown in FIG. 10E. (Alternatively, phosphor development can involve deposition of oppositely charged phosphor landing on appropriately charged locations of the organic photoconductor.) The steps of corona charging as shown in FIG. 10C, exposing and discharging as shown in 10D, and developing by the application of charged phosphor particles 11 can be repeated to deposit additional phosphor colors. When all of the desired color phosphor deposits are applied to the anode plate 4, the anode plate can then be fixed and filmed as represented in FIG. 10F. Following filming, a reflective metal film can be applied to the anode plate and the anode plate can be combined to a cathode plate 7 to complete the FED device. After the finishing of the FED, the FED is then joined to the back of the LCD to provide the backlighting for the LCD. The FED devices made according the processes disclosed herein, can be also made for use as direct display devices, which do not involve liquid crystal front end components.

The invention claimed is:

1. A liquid crystal display comprising:
    a liquid crystal front end component having a plurality of liquid crystal pixels, the liquid crystal pixels being aligned in repeat columns, the repeat columns having a pitch, the repeat columns extending in a first direction; and,
    a field emission backlight component having a plurality of individual elements of phosphor, the individual elements of phosphor being aligned in columns, the columns of the individual elements of phosphor extending in the first direction;
    wherein the adjacent columns of the plurality of individual elements of phosphor have center-to-center spacings that are larger than the pitch of the repeat columns of the liquid crystal pixels.

2. The liquid crystal display of claim 1, wherein the columns of the individual elements of phosphor are grouped into repeat units and different columns in the repeat units differ in color.

3. The liquid crystal display of claim 2, wherein the individual elements of the field emission backlight component are programmable and synchronized such that selected groups of the individual elements will activate in conjunction with activation of associated liquid crystal cells of the liquid crystal component.

4. The liquid crystal display of claim 2, wherein at least some of the individual elements comprise a water incompatible phosphor.

5. The liquid crystal display of claim 4, wherein one phosphor of the plurality of individual elements is strontium thiogallate:europium.

6. The liquid crystal display of claim 2, wherein the field emission backlight component has 10 or more of the repeat units.

7. The liquid crystal display of claim 6, wherein the individual elements of the field emission backlight component are programmable and synchronized such that selected groups of the individual elements will activate in conjunction with activation of associated liquid crystal cells of the liquid crystal component.

8. The liquid crystal display of claim 6, wherein the field emission backlight component operates at 10-20 kV.

9. The liquid crystal display of claim 1, wherein at least some of the individual elements comprise a water incompatible phosphor.

10. The liquid crystal display of claim 9, wherein one phosphor of the plurality of individual elements is strontium thiogallate:europium.

11. The liquid crystal display of claim 1, wherein the individual elements of the field emission backlight component are programmable and synchronized such that selected groups of the individual elements will activate in conjunction with activation of associated liquid crystal cells of the liquid crystal component.

12. The liquid crystal display of claim 1, wherein a ratio of the number of columns of the individual elements of phosphor to the number of repeat columns of liquid crystal pixels is in the range of 1:3-1000.

13. The liquid crystal display of claim 12, wherein the individual elements of the field emission backlight component are programmable and synchronized such that selected groups of the individual elements will activate in conjunction with activation of associated liquid crystal cells of the liquid crystal component.

14. The liquid crystal display of claim 13, wherein an anode plate and a cathode plate of the field emission backlight component have a spacing of 1-5 mm.

15. The liquid crystal display of claim 12, wherein the field emission backlight component operates at 10-20 kV.

16. The liquid crystal display of claim 1, wherein a ratio of the number of columns of the individual elements of phosphor to the number of repeat columns of liquid crystal pixels is in the range of 1:100-1000.

17. The liquid crystal display of claim 16, wherein the individual elements of the field emission backlight component are programmable and synchronized such that selected groups of the individual elements will activate in conjunction with activation of associated liquid crystal cells of the liquid crystal component.

18. The liquid crystal display of claim 17, wherein an anode plate and a cathode plate of the field emission backlight component have a spacing of 1-5 mm.

19. The liquid crystal display of claim 1, wherein the field emission backlight component has a cathode comprising carbon nanotubes for emitting electrons which are to strike the phosphor of the plurality of individual elements.

20. The liquid crystal display of claim 1, wherein the columns of the individual elements of phosphor are grouped into repeat units and different columns in the repeat units differ in color.

21. The liquid crystal display of claim 20, wherein the individual elements of the field emission backlight component are programmable and synchronized such that selected groups of the individual elements will activate in conjunction with activation of associated liquid crystal cells of the liquid crystal component.

22. The liquid crystal display of claim 21, wherein at least some of the individual elements comprise a water incompatible phosphor.

23. The liquid crystal display of claim 22, wherein one phosphor of the plurality of individual elements is strontium thiogallate:europium.

24. The liquid crystal display of claim 23, wherein the field emission backlight component operates at 10-20 kV.

\* \* \* \* \*